(12) United States Patent
Tomimatsu

(10) Patent No.: US 6,770,511 B2
(45) Date of Patent: Aug. 3, 2004

(54) SEMICONDUCTOR DEVICE, AND ITS MANUFACTURING METHOD, CIRCUIT SUBSTRATE, AND ELECTRONIC APPARATUS

(75) Inventor: Hiroyuki Tomimatsu, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/370,699

(22) Filed: Feb. 24, 2003

(65) Prior Publication Data

US 2003/0207510 A1 Nov. 6, 2003

(30) Foreign Application Priority Data

Feb. 25, 2002 (JP) ........................................ 2002-048321

(51) Int. Cl.⁷ ............................................... H01L 21/44
(52) U.S. Cl. ...................................... 438/109; 257/786
(58) Field of Search ........................... 438/51, 55, 106, 438/109, 617; 257/666, 676, 686, 723, 777, 784, 786

(56) References Cited

U.S. PATENT DOCUMENTS 6,161,753 A * 12/2000 Tsai et al. ................ 228/180.5
6,340,846 B1 * 1/2002 LoBianco et al. .......... 257/783
6,391,759 B1 * 5/2002 Chao et al. ................. 438/617
6,429,536 B1 * 8/2002 Liu et al. .................... 257/786

* cited by examiner

Primary Examiner—David Nelms
Assistant Examiner—David Vu
(74) Attorney, Agent, or Firm—Oliff & Berridge, PLC

(57) ABSTRACT

The invention realizes preferential routing of wires. A semiconductor device includes leads, a plurality of semiconductor chips stacked in layers, first wires that electrically connect a first semiconductor chip among the plurality of semiconductor chips to the leads, second wires that electrically connect a second semiconductor chip stacked on the first semiconductor chip among the plurality of semiconductor chips to the leads, and first and second bent sections formed in the second wires, each having a curvature greater than other parts thereof. The second wires extend toward the first bent section above the leads, upwardly diagonally extend from the first bent section toward the second semiconductor chip, and downwardly extend from the second bent section to electrically connect to the second semiconductor chip.

19 Claims, 4 Drawing Sheets

$\theta_1 > \theta_3 > \theta_2$

SEMICONDUCTOR DEVICE, AND ITS MANUFACTURING METHOD, CIRCUIT SUBSTRATE, AND ELECTRONIC APPARATUS

BACKGROUND OF THE INVENTION

1. Field of Invention

The present invention relates to semiconductor devices, methods for manufacturing the same, circuit substrates and electronic apparatuses.

2. Description of Related Art

The related art includes semiconductor devices in which a plurality of semiconductor chips are stacked one on top of the other. In such related art semiconductor devices, electrical connections can be provided by bonding electrodes of the semiconductor chips to wires. It is important that wires to be connected to a semiconductor chip on an upper side should not contact wires to be connected to a semiconductor chip on a lower side. It is also important to form a trajectory of the wires such that the height of the entire loops of wires is lowered, and the length of wires is shortened. Also, it is necessary to avoid contact between the wires and corner sections of the semiconductor chips.

SUMMARY OF THE INVENTION

The present invention addresses or solves the above and/or other problems, and realizes a preferable wire routing.

A semiconductor device in accordance with the present invention includes: leads; a plurality of semiconductor chips stacked in layers; first wires that electrically connect a first semiconductor chip of the plurality of semiconductor chips to the leads; second wires that electrically connect a second semiconductor chip stacked on the first semiconductor chip of the plurality of semiconductor chips to the leads; and first and second bent sections formed in the second wires, each having a curvature greater than other parts thereof. The second wires extend toward the first bent section above the leads, upwardly diagonally extend from the first bent section toward the second semiconductor chip, and downwardly extend from the second bent section to electrically connect to the second semiconductor chip.

In accordance with the present invention, the first and second bent sections are formed in the second wires. The second bent section is formed closer to the second semiconductor chip than the first bent section to the second semiconductor chip, and defines the topmost point in the second wires. As a result, a distance can be secured between the second wires and corner sections of the second semiconductor chip, and contact between the two can be avoided or substantially avoided. Furthermore, the distance between the first and second wires can be adjusted by the first bent section. In other words, the topmost point of the second wires can be made lower and the distance between the first and second wires can be better secured as compared to the case where the second wires directly extend from the leads to the second bent section. Accordingly, routing of the second wires in the shortest length or substantially the shortest length can be realized in low loops.

In the semiconductor device, the second wires may be bonded to electrodes of the second semiconductor chip after having been bonded to the leads.

In the semiconductor device, the first bent section may be formed at a position lower than the height of the first wires.

In the semiconductor device, an angle defined by a tangential line at the first bent section and a surface of the leads on the side of the second semiconductor chip may be smaller than an angle defined by a tangential line at an intermediate section in a height direction of the first wires and the surface of the leads on the side of the first semiconductor chip.

In the semiconductor device, an angle defined by a tangential line at a portion of the second wires in an area from the first bent section toward the leads on the side of the second semiconductor chip may be greater than an angle defined by the tangential line at the intermediate section in the height direction of the first wires and the surface of the leads on the side of the first semiconductor chip.

As a result, the first bent section can be separated from the first wires, such that a distance between the first and second wires can be secured.

In the semiconductor device, the second bent section maybe formed on an inner side of the first semiconductor chip.

In the semiconductor device, the second bent section may be formed at a position higher than the second semiconductor chip by at least a width of the second wires.

As a result, contact between the second wires and corner sections of the second semiconductor chip can be securely avoided.

In the semiconductor device, the second wires may extend to connect the first and second bent sections in generally the shortest distance.

As a result, the second wires can be shortened as much as possible.

In the semiconductor device, the leads may be wiring patterns supported by a substrate.

A circuit substrate in accordance with the present invention has the semiconductor device described above mounted thereon.

An electronic apparatus has the semiconductor device described above.

A method for manufacturing a semiconductor device in accordance with the present invention includes: forming first wires that electrically connect a first semiconductor chip of a plurality of semiconductor chips to leads; forming second wires, which electrically connect a second semiconductor chip stacked on the first semiconductor chip of the plurality of semiconductor chips to the leads, with first and second bent sections, each having a curvature greater than other parts thereof; and leading the second wires to extend toward the first bent section above the leads, to extend upwardly diagonally from the first bent section toward the second semiconductor chip, and to extend downwardly from the second bent section to electrically connect to the second semiconductor chip.

In accordance with the present invention, the second wires having the first and second bent sections are formed. The second bent section is formed closer to the second semiconductor chip than the first bent section to the second semiconductor chip, and defines the topmost point in the second wires. As a result, a distance can be secured between the second wires and corner sections of the second semiconductor chip, and contact between the two can be avoided or substantially avoided. Furthermore, the distance between the first and second wires can be adjusted by the first bent section. In other words, the topmost point of the second wires can be made lower and the distance between the first and second wires can be better secured as compared to the case where the second wires are led directly from the leads to the second bent section. Accordingly, routing of the second wires in the shortest length or substantially the shortest length can be realized in low loops.

In the method for manufacturing a semiconductor device, the first bent section may be formed at a position lower than the height of the first wires.

In the method for manufacturing a semiconductor device, the second wires may be formed such that an angle defined by a tangential line at the first bent section and a surface of the leads on the side of the second semiconductor chip is smaller than an angle defined by a tangential line at an intermediate section in a height direction of the first wires and the surface of the leads on the side of the first semiconductor chip.

In the method for manufacturing a semiconductor device, the second wires may be formed such that an angle defined by a tangential line at a portion of the second wires in an area from the first bent section toward the leads on the side of the second semiconductor chip is greater than an angle defined by the tangential line at the intermediate section in the height direction of the first wires and the surface of the leads on the side of the first semiconductor chip.

As a result, the first bent section can be separated from the first wires, and therefore a distance between the first and second wires can be secured.

In the method for manufacturing a semiconductor device, the second bent section may be formed on an inner side of the first semiconductor chip.

In the method for manufacturing a semiconductor device, the second bent section may be formed at a position higher than the second semiconductor chip by at least a width of the second wires.

As a result, contact between the second wires and corner sections of the second semiconductor chip can be securely avoided.

In the method for manufacturing a semiconductor device, the second wires may be led to connect the first and second bent sections in generally the shortest distance.

As a result, the second wires can be shortened as much as possible.

In the method for manufacturing a semiconductor device, the leads may be wiring patterns supported by a substrate.

DETAILED DESCRIPTION OF PREFERRED EMBODIMENTS

An exemplary embodiment of the present invention is described below with reference to the accompanying drawings. However, the present invention is not limited to the exemplary embodiment described below.

Figure 1:
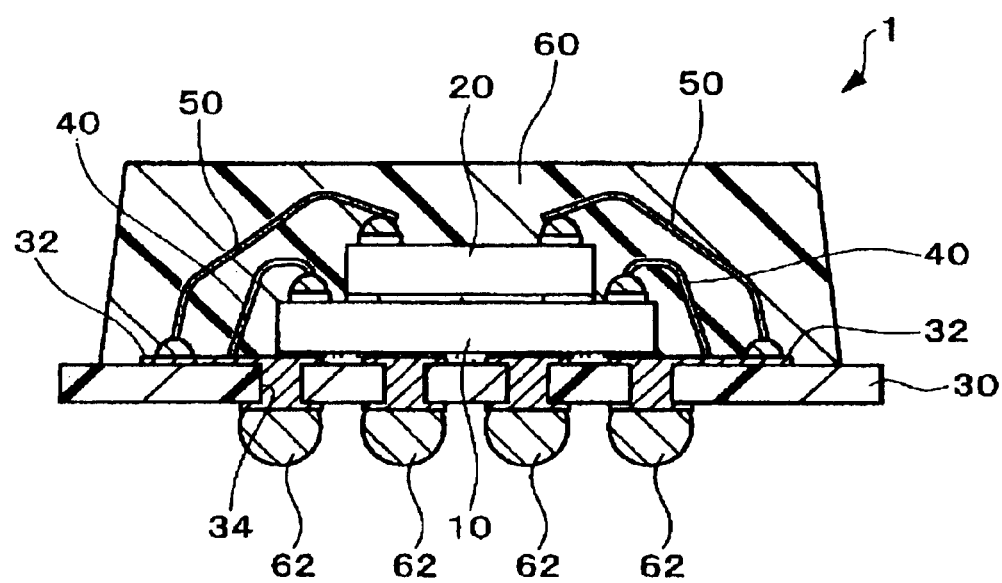
FIG. 1 is a schematic that shows a semiconductor device in accordance with an exemplary embodiment of the present invention.
Figure 2:
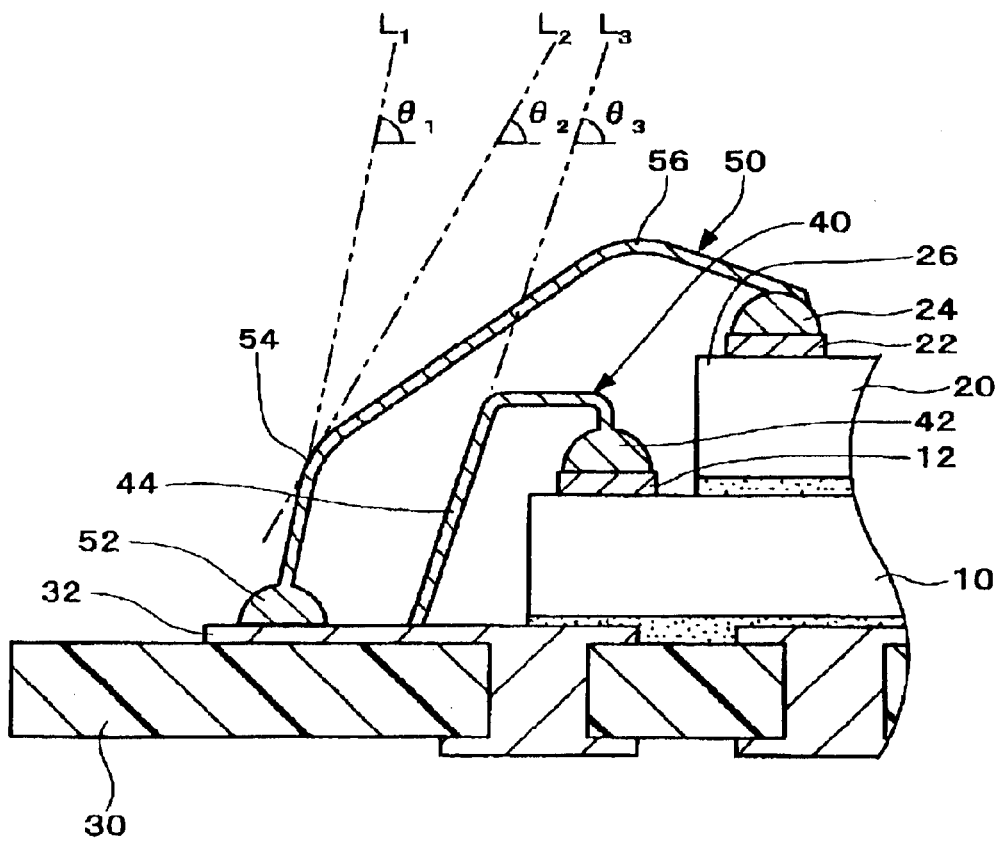
FIG. 2 is a partially enlarged schematic of the device of FIG. 1.

FIGS. 1–4 are schematics that show a semiconductor device in accordance with the exemplary embodiment of the present invention, and a method for manufacturing the same. FIG. 1 shows the semiconductor device in accordance with the present exemplary embodiment, and FIG. 2 is a partially enlarged schematic of the device of FIG. 1. The semiconductor device in accordance with the present exemplary embodiment includes a plurality of semiconductor chips (including first and second semiconductor chips 10 and 20), a substrate 30, a plurality of wires (including first and second wires 40 and 50) that are bonded to the plurality of semiconductor chips.

The plurality of semiconductor chips are stacked in three dimensions. The semiconductor device 1 is referred to as a stack type (or three-dimensional mounting type) semiconductor device. In the example shown in FIG. 1, the plurality of semiconductor chips are only two semiconductor chips (only the first and second semiconductor chips 10 and 20). However, the plurality of semiconductor chips may include three or more semiconductor chips. The first and second semiconductor chips indicate two of the plurality of semiconductor chips that are directly stacked one on top of the other. The semiconductor chips may be, for example, flash memories, SRAMs, DRAMs, ASICs or MPUs. Combinations of plural semiconductor chips may include one with an ASIC, a flash memory and an SRAM, one with plural SRAMs alone, one with plural DRAMs alone, or one with a flush memory and an SRAM.

The shape of the first semiconductor chip 10 is not limited and can be any shape, but may often be in a rectangular solid (including cubic) configuration. The semiconductor chip 10 includes an integrated circuit (not shown), and at least one electrode (plural electrodes in many cases) 12 that is electrically connected to the integrated circuit. The electrode 12 may be a flat pad thinly formed on a surface of the first semiconductor chip 10. As shown in FIG. 2, the electrodes 12 may be formed in an end section of the surface of the first semiconductor chip 10 (for example, near two or four of the sides of the exterior configuration). The electrodes 12 may often be formed from aluminum metal or copper metal. A passivation film (not shown) is formed over the semiconductor chip 10 to cover the end section while avoiding central portions of the electrodes 12. The passivation film may be formed of, for example, $SiO_2$, SiN, polyimide resin or the like.

In the example shown in FIG. 1, the exterior configuration of the second semiconductor chip 20 is smaller than the exterior configuration of the first semiconductor chip 10. As a result, the second semiconductor chip 20 can be mounted on the first semiconductor chip 10 while avoiding the electrodes 12. The second semiconductor chip 20 may preferably be mounted on a central section of the first semiconductor chip 10.

The second semiconductor chip 20 has electrodes 22, and bumps 24 are provided on the electrodes 22. By providing the bumps 24, the second wires 50 and the electrodes 22 can be electrically connected without damaging the electrodes 22 that serve as bases when a second bonding on the second wires 50 is conducted. The bumps 24 may preferably be formed with the same material (for example, gold) as that of the second wires 50.

The substrate 30 is referred to as an interposer of the semiconductor device. The substrate 30 may be formed with an organic material (polyimide substrate) or an inorganic material (ceramic substrate, glass substrate), or may be formed with a composite structure of these materials (glass epoxy substrate). The substrate 30 may be formed of a single layer substrate or a multiple-layer substrate.

The substrate 30 includes wiring patterns formed of a plurality of wires (leads) 32. Electrical connection sections (for example, lands) are formed in the wiring patterns 32. The electrical connection sections are often formed on flat surfaces. The wiring patterns 32 are formed in a manner to be electrically connected from one or both of the surfaces of the substrate 10. For example, as indicated in FIG. 1, a plurality of through holes 34 may be formed in the substrate 30 such that electrical connections can be made from both of the surfaces of the substrate 30. The through holes 34 may be embedded with conductive material or their inner wall surfaces may be plated to define through holes.

As shown in FIG. 1, the first semiconductor chip 10 is mounted with their electrodes 12 facing upward (an opposite side of the substrate 30). The second semiconductor chip 20 is mounted with their electrodes 22 facing upward (the opposite side of the first semiconductor chip 10).

The first wires 40 electrically connect the first semiconductor chip 10 to the wiring patterns 32. The first semiconductor chip 10 is provided with a plurality of first wires 40 in the number corresponding to the number of electrodes 12. A ball bonding method may be employed to form the first wires 40. More specifically, tip portions of the first wires 40 that are led outside a tool (for example, a capillary) may be fused into balls, and the tip portions may be thermocompression-bonded to the electrodes 12 (preferably accompanied by ultrasonic vibrations) to electrically connect the first wires 40 to the electrodes 12. In this case, the tip portions of the first wires 40 become to be the bumps 42. Thereafter, the first wires 40 are bonded to the wiring patterns 32.

In accordance with a modified example of the embodiment, the first wires 40 may be first bonded to the wiring patterns 32 on the substrate 30, and then bonded to the electrodes 12 of the first semiconductor chip 10. In this case, bumps may preferably be provided on the electrodes 12 of the first semiconductor chip 10 before bonding in order to prevent damage to the electrodes 12. The configuration (for example, the loop configuration) of the first wires 40 is not limited to the details described above.

The second wires 50 electrically connect the second semiconductor chip 20 to the wiring patterns 32. The second semiconductor chip 20 is provided with a plurality of second wires 50 in the number corresponding to the number of electrodes 22. The second wires 50 may be electrically connected to common wirings shared by the first wires 40 or may be electrically connected to different wirings. A ball bonding method may also be employed to form the second wires 50. When the second wires 50 are to be first bonded to the wiring patterns 32 on the substrate 30, bumps 52 are provided on the wiring patterns 32, as shown in FIG. 2. Thereafter, the second wires 50 are bonded to the bumps 24 on the electrodes 22.

The second wire 50 have first and second bent sections 54 and 56. The first and second bent sections 54 and 56 each have a curvature greater than (a radius of curvature smaller than) that of other portions of the second wires 50. In other words, a portion with the largest curvature in the second wire 50 corresponds to one of the first bent section 54 and the second bent section 56, and a portion with the second largest curvature corresponds to the other. Either of the first bent section 54 or the second bent section 56 may have the largest curvature.

The first bent section 54 is formed closer to the substrate 30 (more specifically, the wiring patterns 32) than the second bent section 56 to the substrate 30. In other words, the first bent section 54 is formed in the second wire 50, and the second bent section 56 is formed closer to the second semiconductor chip 20 than the first bent section 54 to the semiconductor chip 20.

As shown in FIG. 2, the first bent section 54 may be disposed above the substrate 30 (more specifically, above the wiring pattern 32). In the example shown in FIG. 2, the first bent section 54 is formed at a position shifted in the plane from a bonding section of the wiring pattern 32 (for example, the bump 52). In other words, the second wire 50 diagonally extends from the wiring pattern 32 in a direction toward the second semiconductor chip 20. In this instance, an angle $\theta_1$ (an angle on the side of the second semiconductor chip) defined between a tangential line $L_1$ (in effect, one of a plurality of tangential lines) at a portion of the second wire 50 between the first bent section 54 and the wiring pattern 32 and a surface of the wiring pattern 32 (or a surface of the substrate 30) can be freely decided. The angle $\theta_1$ may preferably be greater than an angle $\theta_3$ (an angle on the side of the first semiconductor chip) defined between a tangential line $L_3$ (in effect, one of a plurality of tangential lines) at an intermediate section 44 in a height direction of the first wire 40 (for example, at a middle point or a point in proximity thereto in the height direction) and the surface of the wiring pattern 32 (or the surface of the substrate 30). As a result, the first bent section 54 can be separated from the first wire 40, and therefore a separation between the first and second wires 40 and 50 can be secured.

In accordance with a modified example, the second wire 50 may extend generally vertically upward from the wiring pattern 32, such that the first bent section 54 may be formed generally right above the bonding section (for example, the bump 52) on the wiring pattern 32.

As shown in FIG. 2, the first bent section 54 may be formed at a position lower than the height of the first wire 40. The position of the first bent section 54 in the height direction may be determined in consideration of the distance between bonding sections of the first and second wires 40 and 50 on the wiring patterns 32, the tilt angle of a portion of the second wires 50 extending up to the first bent section 54, and the like. Alternatively, the first bent section 54 may be formed at a position lower than the height of the second semiconductor chip 20.

In the example shown in FIG. 2, an angle $\theta_2$ (an angle on the side of the second semiconductor chip) defined between a tangential line $L_2$ at the first bent section 54 and the surface of the wiring pattern 32 (or the surface of the substrate 30) is smaller than the angle $\theta_3$ of the first wire 40 described above. In other words, a relationship, $\theta_1 > \theta_3 > \theta_2$, may be established. By so doing, the second wires 50 can be raised upward to the extent that contact with the first wires 40 can be avoided, and the height of the loop configuration can be lowered as much as possible.

The second wires 50 diagonally extend upward from the first bent section 54 in a direction toward the second semiconductor chip 20 (in a opposite direction to the substrate 30). In other words, the second wires 50 diagonally extend upward from a plane parallel to the surface of the wiring patterns 32 (or the surface of the substrate 30) as a reference.

The second bent section 56 defines the topmost section of the second wires 50. In other words, a tangential line (not shown) at the second bent section 56 is parallel with the surface of the wiring patterns 32 (or the surface of the substrate 30). As shown in FIG. 2, the second bent section 56 may be disposed on the inner side of the first semiconductor chip 10. In other words, the second bent section 56 may be disposed within a range of the first semiconductor chip 10 as viewed in a plan view of the first semiconductor chip 10.

The second bent section 56 is disposed at a position higher than the surface of the second semiconductor chip 20. The second bent section 56 is formed at a position higher than the second semiconductor chip 20 by at least a width (diameter) of the second wire 50. As a result, as shown in FIG. 2, contact between the second wire 50 and corner sections (edges) of the second semiconductor chip 20 can be securely avoided. For example, the second bent section 56 may be disposed higher by about 1–2 times (for example, about 25–50 µm) the width (for example, about 25 µm) of the second wire 50.

The second wires 50 extend from the second bent section 56 downward (in a direction toward the substrate 30). More specifically, the second wires 50 extend downward from a plane parallel with the surface of the wiring patterns 32 (or the surface of the substrate 30) as a reference to electrically connect to the electrodes 22 of the second semiconductor chip 20 (to the bumps 24 on the electrodes 22 in FIG. 2).

The second wires 50 extend in a manner to connect the first and second bent sections 54 and 56 in generally the shortest distance. In other words, a portion among the second wires 50 between the first and second bent sections 54 and 56 may be linear. By so doing, the second wires can be shortened as much as possible.

In the example shown in FIG. 1, the semiconductor device 1 includes a sealing section 60 that seals the first and second semiconductor chips 10 and 20 on the substrate 30. The sealing section 60 may be a resin sealing section. A metal mold may be used to provide sealing. For example, a transfer mold may be used to form the sealing section 60 on the substrate 30. Alternatively, a potting method may be used to form the sealing section 60.

In the example shown in FIG. 1, the semiconductor device 1 includes a plurality of external terminals 62. The external terminals 62 may be formed with solder balls. The external terminals 62 are electrically connected to the wiring patterns 32. The external terminals 62 may be formed at positions of the through holes 34. By patterning the wiring patterns 32 to be electrically connected to the first and second semiconductor chips 10 and 20 into a specified configuration, the external terminals 62 can be provided in a wide region extending in the plane in the substrate 30. In other words, the external terminals 62 with different pitches can be provided on the semiconductor device, and therefore it can be readily mounted on a circuit substrate (mother board).

In accordance with a modified example, a part of the wiring pattern 32 on the substrate 30 may be extended out, and an external connection may be made from that part. A part of the wiring pattern 32 may be formed as a lead of a connector, and a connector may be mounted on the substrate 30. Furthermore, the external terminals 62 may not be positively formed. Instead, solder cream that is coated on a circuit substrate upon mounting a semiconductor device on the circuit substrate may be used, and external terminals may be formed eventually by the surface tension of solder being melted. Such a semiconductor device is referred to as a land grid array type semiconductor device.

Aside from the examples described above, instead of the wiring patterns 32, a plurality of semiconductor chips may be electrically connected to leads formed with a lead frame. In this case, the leads have free ends that are not supported by any member. The leads include inner leads and outer leads, and the first and second wires 40 and 50 are bonded to the inner leads. The first and second semiconductor chips 10 and 20 may be mounted on a die pad. Alternatively, when a die pad is not provided, a heat radiation member (for example, a heat sink) may be provided, and the first and second semiconductor chips 10 and 20 may be mounted thereon.

In accordance with the embodiment of the present invention, the first and second bent sections 54 and 56 are formed in the second wires 50. The second bent section 56 is formed closer to the second semiconductor chip 20 than the first bent section 54 to the second semiconductor chip 20, and defines the topmost point in the second wires 50. As a result, a distance can be secured between the second wires 50 and corner sections of the second semiconductor chip 20, and contact between the two can be avoided. Furthermore, the distance between the first and second wires 40 and 50 can be adjusted by the first bent section 54. In other words, the topmost point of the second wires 50 can be made lower and the distance between the first and second wires 40 and 50 can be better secured as compared to the case where the second wires 50 directly extend from the leads (the wiring patterns 32) to the second bent section 56. As a result, the second wires 50 would be difficult to fall, and can be prevented or substantially prevented from being washed away by a sealing material in a sealing step. Accordingly, routing of the second wires 50 in the shortest length or substantially the shortest length can be realized in low loops.

Figure 3:
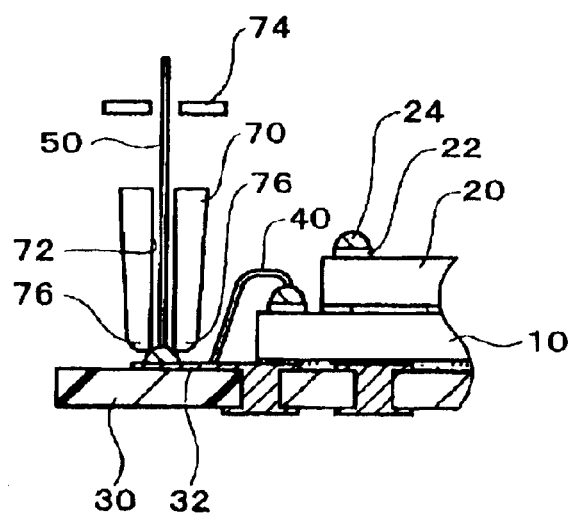
FIG. 3 is a schematic that shows a method for manufacturing semiconductor devices in accordance with an exemplary embodiment of the present invention.
Figure 4:
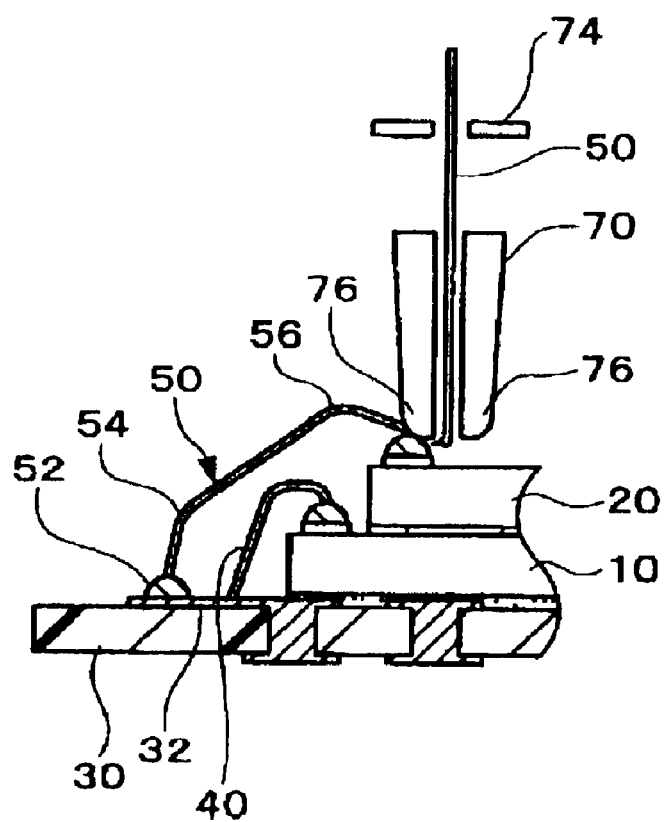
FIG. 4 is a schematic that shows a method for manufacturing semiconductor devices in accordance with an exemplary embodiment of the present invention.

FIGS. 3 and 4 show part of a method for manufacturing a semiconductor device in accordance with an exemplary embodiment of the present invention. The method for manufacturing a semiconductor device in accordance with the embodiment of the present invention includes a process needed to form any one of the structures selected from the details described above, and duplicate portions overlapping with the details described above are omitted.

As shown in FIG. 3, after first and second semiconductor chips 10 and 20 are mounted on a substrate 30, the first semiconductor chip 10 is electrically connected to a wiring pattern 32 by first wires 40. Related art processes can be applied to the process of forming the first wires 40.

A tool (for example, a capillary) that supports the second wire 50 is prepared. The second wire 50 is formed from a conductive material, such as gold. The tool 70 has an aperture 72, and the second wire 50 is passed through the aperture 72. The tool 70 is supported on a main body (a wire bonder) of a manufacturing apparatus (not shown) through a supporting member (not shown) (for example, an ultrasonic horn). The second wire 50 can be moved in up/down directions by opening/closing of a damper 74. An open end section 76 of the tool 70 can press down a part of the second wire 50 (a tip portion that is formed into a ball shape).

The tool 70 is disposed above the wiring pattern 32, and a tip portion of the second wire 50, which is led out of the tool 70, is formed into a ball shape (or a lump). The tip portion may be fused into a ball by thermal energy (for example, electrical discharge or gas flame).

Then, as shown in FIG. 3, the second wire 50 is bonded to the wiring pattern 32. Thereafter, the second wire 50 is provided with first and second bent sections 54 and 56, and led out toward the second semiconductor chip 20. By forming bumps 24 on the electrodes 22 of the second semiconductor chip 20, damages to the electrodes 22 can be avoided at the time of bonding.

As shown in FIG. 4, a part of the second wire 50 is bonded to the bump 24. More specifically, a part of the second wire 50 on a side thereof which has been led out is bonded at the open end section 76. Thereafter, the second wire 50 is torn off at a portion above the bump 24. In this manner, the second wire 50 can be formed above the first wire 40. It is noted that the first wires 40 can also be formed by a process similar to those described above.

The following effects can be obtained by the method for manufacturing semiconductor devices in accordance with the exemplary embodiment of the present invention.

Figure 5:
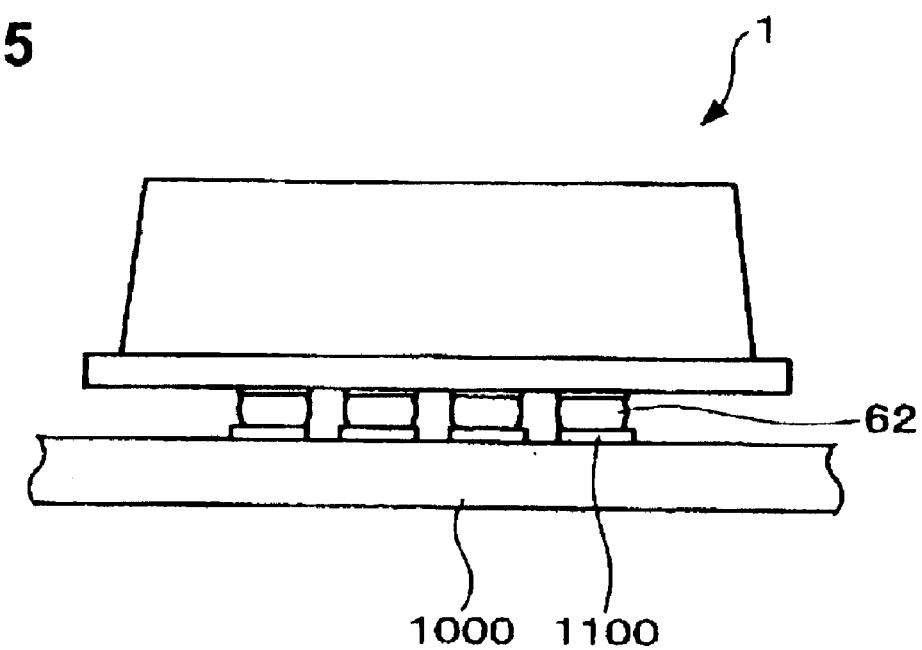
FIG. 5 is a schematic that shows a circuit substrate in accordance with an exemplary embodiment of the present invention.

FIG. 5 shows a circuit substrate to which the exemplary embodiment described above is applied. The semiconductor device 1 is mounted on a circuit substrate 1000. An organic substrate, such as, for example, a glass epoxy substrate can be typically used as the circuit substrate 1000. Wiring patterns 1100 formed of, for example, copper or the like are formed into a desired circuit on the circuit substrate 1000, and the wiring patterns 1100 and external terminals 62 of the semiconductor device are bonded to one another.

Figure 6:
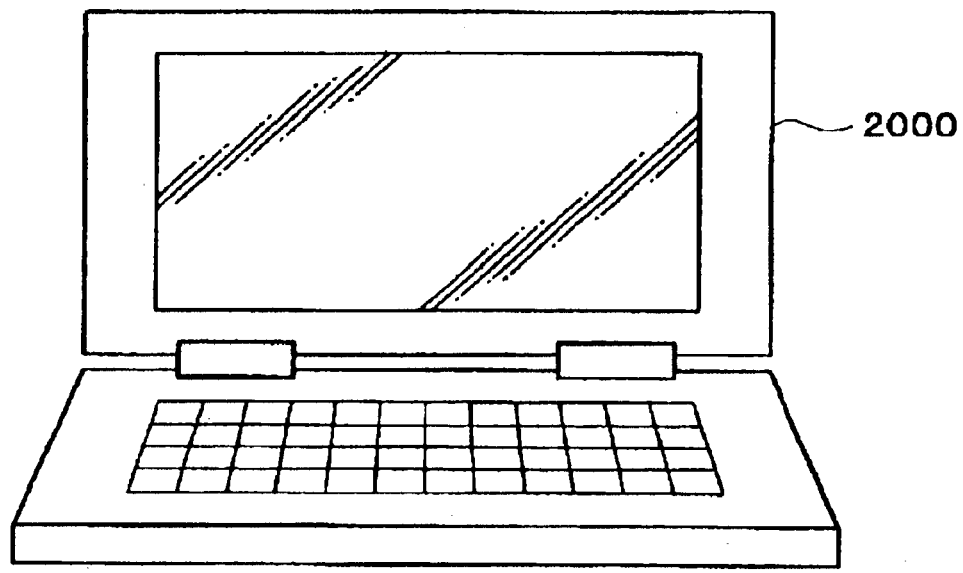
FIG. 6 is a schematic perspective view that shows an electronic apparatus in accordance with an exemplary embodiment of the present invention.
Figure 7:
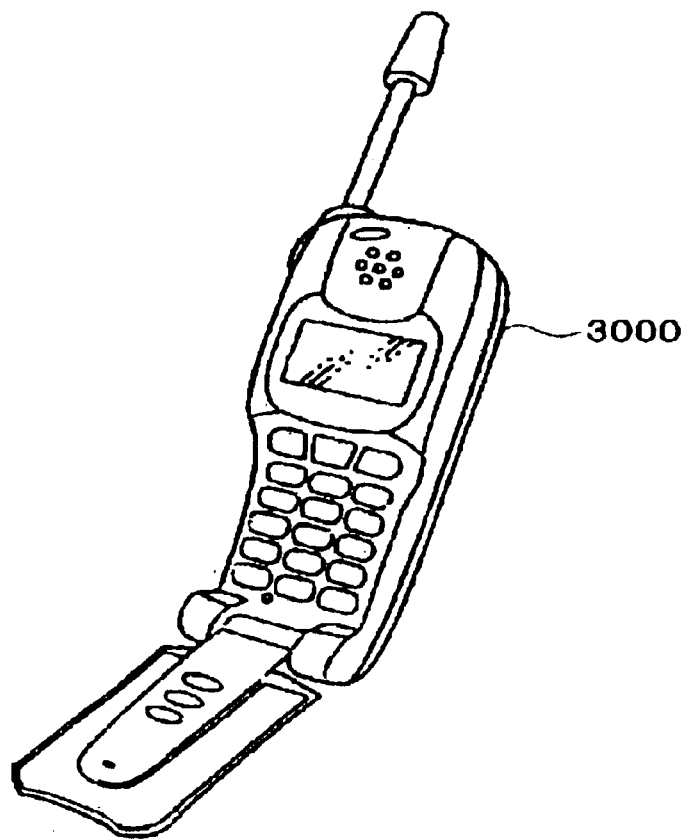
FIG. 7 is a schematic perspective view that shows an electronic apparatus in accordance with an exemplary embodiment of the present invention.

Various electronic apparatuses can incorporate the semiconductor devices in accordance with the exemplary embodiment of the present invention. For example, a notebook type personal computer 2000 shown in FIG. 6, and a portable telephone 3000 shown in FIG. 7, can incorporate the exemplary embodiment.

The present invention is not limited to the exemplary embodiments described above, and many modification can be made. For example, the present invention may include compositions that are substantially the same as the compositions described in the exemplary embodiments (for example, a composition that has the same functions, the same methods and the results, or a composition that have the same objects and results). Also, the present invention includes compositions in which portions not essential in the compositions described in the exemplary embodiments are replaced with others. Also, the present invention includes compositions that achieve the same functions and effects or achieve the same effects as those of the compositions described in the exemplary embodiments. Furthermore, the present invention includes compositions that include known or later developed technology added to the compositions described in the exemplary embodiments.

What is claimed is:

1. A semiconductor device, comprising:
leads;
a plurality of semiconductor chips stacked in layers, the plurality of semiconductor chips including a first semiconductor chip and a second semiconductor chip stacked on the first semiconductor chip;
first wires that electrically connect the first semiconductor chip of the plurality of semiconductor chips to the leads;
second wires that electrically connect the second semiconductor chip of the plurality of semiconductor chips to the leads; and
first and second bent sections formed in the second wires, each having a curvature greater than other parts of the second wires;
the second wires extending toward the first bent section above the leads, upwardly diagonally extending from the first bent section toward the second semiconductor chip, and downwardly extending from the second bent section to electrically connect to the second semiconductor chip.

2. The semiconductor device according to claim 1, the second wires being bonded to electrodes of the second semiconductor chip after having been bonded to the leads.

3. The semiconductor device according to claim 1, the first bent section being formed at a position lower than a height of the first wires.

4. The semiconductor device according to claim 1, an angle defined by a tangential line at the first bent section and a surface of the leads on the side of the second semiconductor chip being smaller than an angle defined by a tangential line at an intermediate section in a height direction of the first wires and the surface of the leads on the side of the first semiconductor chip.

5. The semiconductor device according to claim 1, an angle defined by a tangential line at a portion of the second wires in an area from the first bent section toward the leads on the side of the second semiconductor chip being greater than an angle defined by the tangential line at the intermediate section in the height direction of the first wires and the surface of the leads on the side of the first semiconductor chip.

6. The semiconductor device according to claim 1, the second bent section being formed on an inner side of the first semiconductor chip.

7. The semiconductor device according to claim 1, the second bent section being formed at a position higher than the second semiconductor chip by at least a width of the second wires.

8. The semiconductor device according to claim 1, the second wires extending to connect the first and second bent sections in generally the shortest distance.

9. The semiconductor device according to claim 1, the leads being wiring patterns supported by a substrate.

10. An assembly, comprising:
a circuit substrate; and
the semiconductor device according to claim 1 mounted on the circuit substrate.

11. An electronic apparatus, comprising:
the semiconductor device according to claim 1.

12. A method for manufacturing a semiconductor device, comprising:
forming first wires that electrically connect a first semiconductor chip of a plurality of semiconductor chips to leads;
forming second wires, which electrically connect a second semiconductor chip stacked on the first semiconductor chip of the plurality of semiconductor chips to the leads, with first and second bent sections, each having a curvature greater than other parts of the second wires; and
leading the second wires to extend toward the first bent section above the leads, to extend upwardly diagonally from the first bent section toward the second semiconductor chip, and to extend downwardly from the second bent section to electrically connect to the second semiconductor chip.

13. The method for manufacturing a semiconductor device according to claim 12, further including forming the first bent section at a position lower than a height of the first wires.

14. The method for manufacturing a semiconductor device according to claim 12, further including forming the second wires such that an angle defined by a tangential line at the first bent section and a surface of the leads on the side of the second semiconductor chip is smaller than an angle defined by a tangential line at an intermediate section in a height direction of the first wires and the surface of the leads on the side of the first semiconductor chip.

15. The method for manufacturing a semiconductor device according to claim 12, further including forming the second wires such that an angle defined by a tangential line at a portion of the second wires in an area from the first bent section toward the leads on the side of the second semiconductor chip is greater than an angle defined by the tangential line at the intermediate section in the height direction of the first wires and the surface of the leads on the side of the first semiconductor chip.

16. The method for manufacturing a semiconductor device according to claim 12, further including forming the second bent section on an inner side of the first semiconductor chip.

17. The method for manufacturing a semiconductor device according to claim 12, further including forming the second bent section at a position higher than the second semiconductor chip by at least a width of the second wires.

18. The method for manufacturing a semiconductor device according to claim 12, further including leading the second wires to connect the first and second bent sections in generally the shortest distance.

19. The method for manufacturing a semiconductor device according to claim 12, further including providing the leads to be wiring patterns supported by a substrate.

* * * * *